United States Patent
Bhat et al.

(10) Patent No.: US 7,976,897 B2
(45) Date of Patent: Jul. 12, 2011

(54) THERMAL CHEMICAL VAPOR DEPOSITION METHODS, AND THERMAL CHEMICAL VAPOR DEPOSITION SYSTEMS

(75) Inventors: Vishwanath Bhat, Boise, ID (US); Gordon Morrison, Boise, ID (US)

(73) Assignee: Micron Technology, Inc, Boise, ID (US)

( * ) Notice: Subject to any disclaimer, the term of this patent is extended or adjusted under 35 U.S.C. 154(b) by 958 days.

(21) Appl. No.: 11/709,509

(22) Filed: Feb. 21, 2007

(65) Prior Publication Data
US 2008/0199613 A1 Aug. 21, 2008

(51) Int. Cl.
*C23C 16/00* (2006.01)
(52) U.S. Cl. .................... 427/248.1; 118/715
(58) Field of Classification Search .............. None
See application file for complete search history.

(56) References Cited

U.S. PATENT DOCUMENTS

| | | | |
|---|---|---|---|
| 6,436,820 B1 * | 8/2002 | Hu et al. | 438/656 |
| 6,770,145 B2 * | 8/2004 | Saito | 118/726 |
| 6,773,687 B1 * | 8/2004 | Hasegawa | 423/210 |
| 2001/0011526 A1 * | 8/2001 | Doering et al. | 118/729 |
| 2002/0155219 A1 * | 10/2002 | Wang et al. | 427/255.391 |
| 2004/0081757 A1 * | 4/2004 | Ishizaka et al. | 427/248.1 |
| 2004/0110356 A1 * | 6/2004 | Yoon | 438/396 |
| 2005/0016956 A1 * | 1/2005 | Liu et al. | 216/67 |
| 2005/0081786 A1 * | 4/2005 | Kubista et al. | 118/715 |

* cited by examiner

*Primary Examiner* — Timothy H Meeks
*Assistant Examiner* — Joseph Miller, Jr.
(74) *Attorney, Agent, or Firm* — Wells St. John, P.S.

(57) ABSTRACT

One embodiment thermal chemical vapor deposition method includes exposing a substrate within a chamber to first and second deposition precursors effective to thermally chemical vapor deposit a material on the substrate, and exhausting unreacted first and second deposition precursors from the chamber through a vacuum pump via a first exhaust line comprising a filter. A reactive gas is flowed to the material on the substrate, with the reactive gas being reactive with the material. After flowing the reactive gas, an inert purge gas is flowed through the chamber and through the vacuum pump. The flowing of the inert purge gas to the vacuum pump is through a second exhaust line not comprising the filter. The exposing, the flowing of the reactive gas, and the flowing of the inert purge gas are repeated effective to deposit material of desired thickness on the substrate.

17 Claims, 1 Drawing Sheet

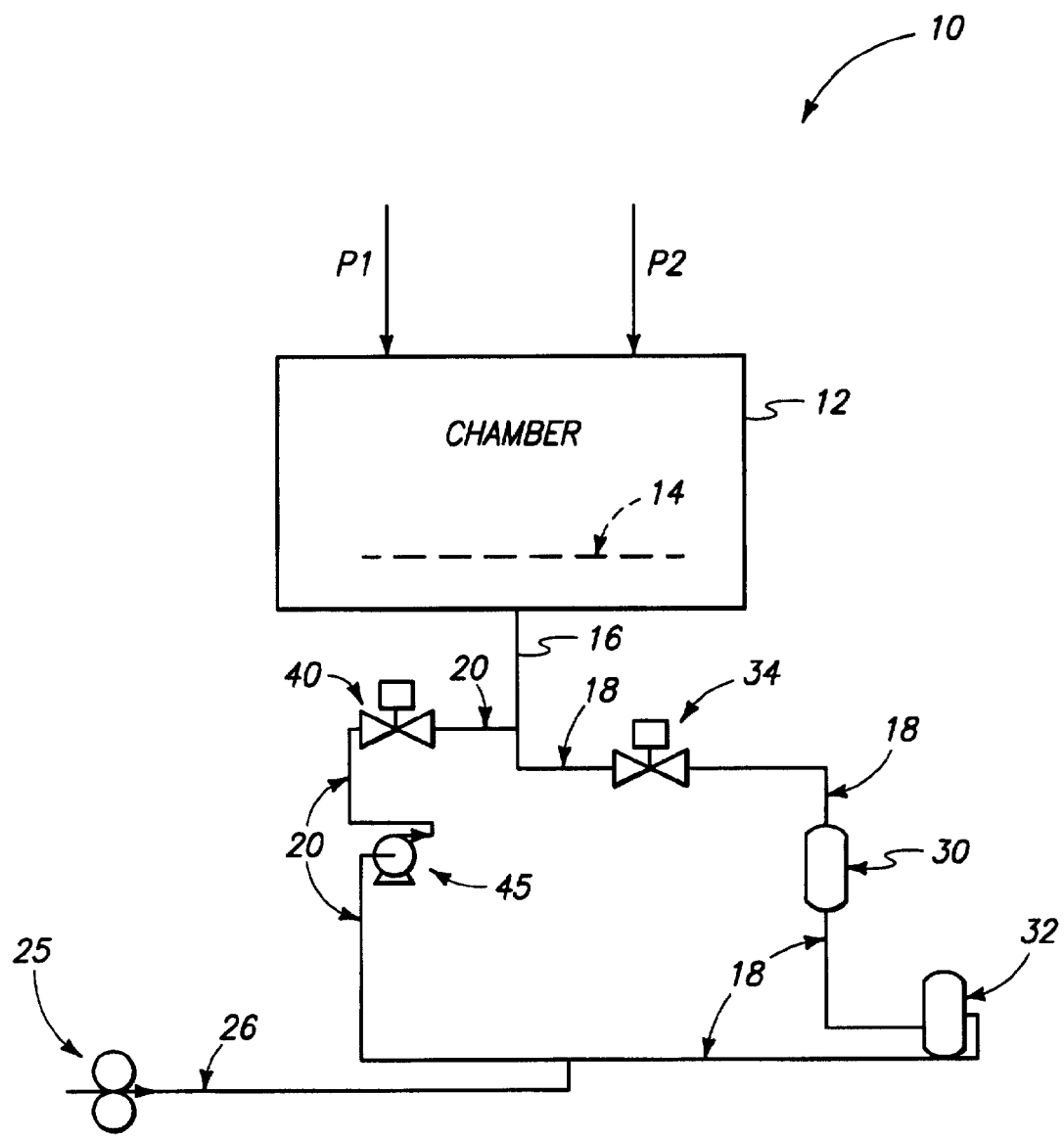

US 7,976,897 B2

THERMAL CHEMICAL VAPOR DEPOSITION METHODS, AND THERMAL CHEMICAL VAPOR DEPOSITION SYSTEMS

TECHNICAL FIELD

Embodiments of the invention pertain to thermal chemical vapor deposition methods, and to thermal chemical vapor deposition systems.

BACKGROUND

Thermal chemical vapor deposition (CVD) is a method used in the fabrication of integrated circuitry for depositing one or more insulative, conductive, or semiconductive materials onto a substrate. First and second deposition precursors are provided to a chamber within which a substrate is received. The substrate and/or chamber are provided at a desired elevated temperature, and the precursors react to deposit a suitable material onto the substrate. More than two deposition precursors and one or more carrier gases might also be used.

One prior art thermal CVD process uses $TiCl_4$ and $NH_3$ as deposition precursors in depositing TiN. The desired reaction by-product is HCl which is exhausted from the chamber. However, other reaction by-products are created, and regardless chlorine can undesirably remain in the deposited material.

One existing manner of minimizing chlorine incorporation includes repeating a sequence of deposition steps. In a first step, $TiCl_4$ and $NH_3$ are flowed to the substrate to deposit a layer of TiN which is thinner than the desired ultimate thickness. This is followed by an inert purge gas flow to remove unreacted precursor and reaction by-product. After the purge step, $NH_3$ is flowed to the substrate with the effect being chlorine removal by formation of HCl and additional nitrogen atom incorporation into the previously deposited material. This is followed by another inert purge step, this one typically lasting from 5 to 10 seconds. The overall process is repeated until a layer of desired thickness is deposited onto the substrate. Existing equipment in which such is conducted is available from Tokyo Electron (TEL), for example the "TRIAS TiN System" or the "TEL Unity System". Such include a plurality of filtering devices in the form of traps to collect unreacted precursors and reaction by-products prior to flowing to a vacuum pump.

While embodiments disclosed herein were motivated in addressing the above issues particular to a thermal CVD of TiN, the disclosure herein is in no way so limited.

BRIEF DESCRIPTION OF THE DRAWINGS

The FIGURE is a diagrammatic representation of one embodiment thermal chemical vapor deposition system in accordance with an embodiment the invention.

DETAILED DESCRIPTION OF EXAMPLE EMBODIMENTS

Embodiments herein include thermal chemical vapor deposition systems, as well as methods of thermal chemical vapor deposition. The system embodiments are not necessarily limited by method, nor are method embodiments necessarily limited by system. One embodiment thermal chemical vapor deposition system is indicated generally with reference 10 in the FIGURE. Such includes a deposition chamber 12 within which a substrate 14 to be deposited upon is to be received. Chamber 12 might be configured for receiving a single wafer or for receiving multiple wafers for thermal chemical vapor deposition. Two precursor feed lines P1 and P2 are diagrammatically shown feeding to chamber 12. Such might feed separately to chamber 12 as shown, alternately might combine prior to feeding to chamber 12, might feed to a showerhead received within chamber 12, might feed to different locations to chamber 12, etc.

A foreline 16 extends from chamber 12. In the context of this document, a "foreline" is any line extending from a deposition chamber through which gas is exhausted from a deposition chamber. A first exhaust line 18 connects with foreline 16 and a second exhaust line 20 connects with foreline 16. First exhaust line 18 and second exhaust line 20 are in fluid parallel communication relative one another with and downstream of deposition chamber 12. Such are depicted relative to a single foreline 16 although exhaust lines 18 and 20 might connect directly with chamber 12, and regardless multiple forelines might of course be utilized.

First exhaust line 18 and second exhaust line 20 are in downstream fluid parallel communication with a vacuum pump 25. Multiple vacuum pumps might of course be utilized, and whether connected in series or parallel relative one another. Regardless, a single vacuum pump feedline 26 is shown as feeding vacuum pump 25, with the first and second exhaust lines 18, 20 respectively connecting therewith and thereby being in downstream fluid parallel communication with vacuum pump feedline 26.

The first exhaust line comprises a filter and an isolation valve upstream thereof. FIG. 1 depicts first exhaust line 18 comprising multiple filters 30, 32 and an isolation valve 34 upstream of all filters in first exhaust line 18. By way of examples only, an example filter 30 is any suitable self-regenerating trap largely useable for chemical filtering, and an example filter 32 is any suitable mechanical trap for example a column trap largely for solid particulate filtering. Filters 30, 32 might filter/trap with respect to any unreacted deposition precursors flowing through the chamber, to any reaction by-product, and/or to any other material exiting chamber 12, for example to protect exhaust pumping equipment, such as vacuum pump 25.

Second exhaust line 20 of example embodiment system 10 comprises an isolation valve 40 and another pump 45 downstream of second exhaust line isolation valve 40 and upstream of vacuum pump 25. In one embodiment and as depicted, second exhaust line 20 is devoid of any filters. An example pump is a turbomolecular pump. Regardless, pump 45 may be of the same, lesser, or greater pumping capacity than vacuum pump 25. In one embodiment, pump 45 has the same pumping capacity as that of vacuum pump 25. In one embodiment, pump 45 has greater pumping capacity than that of vacuum pump 25.

In one embodiment, a thermal chemical vapor deposition system comprises a deposition chamber within which a substrate to be deposited upon is to be received. First and second fluid parallel exhaust lines are in fluid communication with the chamber downstream thereof. The first and second exhaust lines are in downstream fluid parallel communication with a vacuum pump. In one embodiment, the first exhaust line comprises a filter and an isolation valve upstream of the filter, and the second exhaust line comprises an isolation valve and is devoid of any filters independent of whether another pump is included in the second exhaust line. In one embodiment, the first exhaust line comprises an isolation valve independent of whether including one or more filters, and the second exhaust line comprises an isolation valve and another pump downstream of the second exhaust line isolation valve and upstream of the vacuum pump independent of whether containing any filters in the second exhaust line.

Other embodiments include thermal chemical vapor deposition methods independent of whether using the above-described embodiment systems. However by way of example only, example embodiment methods are described below using the example system 10 in the FIGURE. In one embodiment, a substrate within a chamber is exposed to first and second deposition precursors effective to thermally chemical deposit a material on the substrate. More than first and second deposition precursors might of course be utilized, as well as one or more carrier and/or inert gases. By way of example only, the system 10 of the FIGURE might be utilized for feeding a first deposition precursor P1 and a second deposition precursor P2 for exposure of a substrate 14 within chamber 12 thereto. Such might be in the context of a single substrate received within a chamber, or multiple substrates received within a chamber.

By way of example only and where the deposited material comprises TiN, an example first deposition precursor comprises $TiCl_4$ and an example second precursor comprises $NH_3$. In another example where $Si_3N_4$ is to be deposited, example first deposition precursors include one or both of a silane and tetraethylorthosilicate (TEOS), with an example second deposition precursor being $NH_3$. As another example where the deposited material comprises TaN, an example first deposition precursor comprises $TaCl_5$ and an example second deposition precursor comprises $NH_3$. Regardless, such thermal chemical vapor deposition might be with a hot-wall or a cold-wall reactor, and with or without the susceptor on which the substrate rests being separately heated. One particular example includes a single wafer, hot-wall, reactor having wall temperature set at from about 100° C. to about 200° C., with about 150° C. being a specific example. An example susceptor temperature range is from about 450° C. to about 700° C., more narrowly from about 550° C. to about 650° C., with about 600° C. being a specific example. Pressure is desirably subatmospheric, with an example range being from about 1.5 Torr to about 5 Torr, more narrowly from about 1 Torr to about 2 Torr, with about 1 Torr being a specific example. For deposition of TiN, an example flow rate for each of $TiCl_4$ and $NH_3$ is from about 50 sccm to about 10 sccm, with about 70 sccm being a specific example flow rate for each. An example deposition rate is from about 3 Angstroms to about 5 Angstroms per second of a TiN-comprising material. Such might comprise incorporated chlorine as identified in the Background section above. Regardless, an example deposition time is from about 3 seconds to about 2 minutes.

Unreacted first and second deposition precursors are exhausted from the chamber through a vacuum pump via a first exhaust line. In one embodiment, the first exhaust line comprises a filter through which unreacted first and second deposition precursors are exhausted to a vacuum pump. The first exhaust line may comprise more than one filter. In one embodiment, the first exhaust line comprises two filters in series through which unreacted first and second deposition precursors are exhausted. Of course, material other than unreacted first and second deposition precursors might also flow through the first exhaust line, regardless. By way of example only, exhaust line 18 in FIG. 1 of system 10 is an example first exhaust line, and regardless vacuum pump 25 of system 10 is an example vacuum pump.

A reactive gas is flowed to the material on the substrate, with such reactive gas being reactive with the material previously thermally chemical vapor deposited onto the substrate. The reactive gas is reactive with the material to one or both of remove undesired constituents from the deposited material and/or to incorporate at least some portion of the reactive gas into the deposited material. The reactive gas might comprise one of the first and second deposition precursors or might not be comprised of either of the first or second deposition precursors. In one embodiment, for example in the thermal CVD of a TiN-comprising material using deposition precursors of $TiCl_4$ and $NH_3$, an example reactive gas is $NH_3$. By way of example only, such might be reactive to one or both of extract chlorine atoms from the deposited material and exhaust such as HCl, and/or incorporate additional nitrogen atoms into the previously deposited TiN-comprising material. Example temperature and pressure ranges and specifics are as described above in connection with the thermal CVD. An example reactive gas flow rate is 100% $NH_3$ at from about 1000 sccm to about 5000 sccm, with one embodiment being from about 2000 sccm to about 4000 sccm, and about 2000 sccm being a specific example. An example embodiment time of $NH_3$ flow is from about 1 second to 10 seconds. In one embodiment, for example in the thermal CVD of a TiN-comprising material using deposition precursors of $TiCl_4$ and $NH_3$, an example reactive gas is $H_2$. By way of example only, such might be reactive to extract chlorine atoms from the deposited material and exhaust such as HCl. Regardless in one embodiment, such $H_2$ flowing might be combined with flowing of $N_2$ to the chamber.

In one embodiment, an inert purge gas is flowed to the material on the substrate intermediate the exposing of the substrate to the first and second deposition precursors and the flowing of the reactive gas. By way of example only, such an example inert purge gas flow comprises 100% $N_2$ at about 200 sccm for from about 2 to about 5 seconds. In one embodiment, such inert purge gas flowing is through the vacuum pump. In one embodiment, such inert purge gas flowing is also via the first exhaust line.

After flowing of the reactive gas, an inert purge gas is flowed through the chamber and through a second exhaust line and through the vacuum pump. In one embodiment, the second exhaust line does not include the filter or filters of the first exhaust line. In one embodiment, the second exhaust line does not comprise any filters through which the inert purge gas flows to the vacuum pump. Where inert purge gas is flowed to material on the substrate intermediate the exposure to the first and second deposition precursors and the flowing of the reactive gas, such may be considered as a first flowing of an inert purge gas through the chamber, and the flowing of the inert purge gas through the chamber and second exhaust line after flowing of the reactive gas may be considered as a second flowing of an inert purge gas. The inert purge gases utilized during such might be compositionally the same or different. Regardless, the inert purge gas flowing immediately after flowing of the reactive gas in one embodiment is precluded from flowing through the filter in the first exhaust line during at least most, if not all, of the flowing of such inert purge gas. Regardless, an example inert purge gas flowing immediately after flowing of the reactive gas comprises $N_2$ at about 2000 sccm.

In one embodiment, the second exhaust line comprises another pump through which the inert purge gas flows prior to flowing through the vacuum pump during the flowing of the inert purge gas immediately after flowing of the reactive gas. By way of example only, second exhaust line 20 and its associated components in system 10 of the FIGURE is an example such second exhaust line. In one embodiment, the another pump is operated at equal pumping capacity to that of the vacuum pump during flow of the inert purge gas through the another pump. In one embodiment, the another pump is operated at greater pumping capacity than that of the vacuum pump during flow of the inert purge gas through the another pump.

In accordance with the prior art problem which motivated the invention, an inert purge gas flowing after flowing of the $NH_3$-only had to occur for from 5 to 10 seconds to achieve adequate purging. Such was believed to be in part due to flow of the purge gas through one or more filters prior to the vacuum pump, causing flow restriction and thus added time. Flowing of an inert purge gas immediately after flowing of a reactive gas through a second exhaust line not comprising one or more of the filters of the first exhaust line (i.e, at least containing less filters than the first exhaust line, and in one embodiment containing no filters) may facilitate exhausting/evacuating of the chamber of the reactive gas faster. For example, flow of the inert purge gas through the second exhaust line after flow of the reactive gas should enable reduction of such purge gas flow to less than 5 seconds, and even at about 3 seconds or 2 seconds or less if another pump (i.e., pump 45) is utilized. Such may facilitate overall throughput by reducing time.

Regardless, exposing of the first and second deposition precursors for thermal CVD, flowing of the reactive gas, and flowing of the inert purge gas thereafter are repeated effective to deposit material of desired thickness on the substrate. Note that the flow of the reactive gas might be through the first exhaust line and to the vacuum pump, through the second exhaust line and to the vacuum pump, or through both the first and second exhaust lines. In one embodiment, individual of the inert gas flowings immediately after the reactive gas flowings are less than 5 seconds in duration, and in one embodiment are no greater than 3 seconds in duration.

A thermal chemical vapor deposition method in accordance with one embodiment includes exposing a substrate within a chamber to first and second deposition precursors effective to thermally CVD a material on the substrate, and exhausting unreacted first and second deposition precursors from the chamber through a vacuum pump via a first exhaust line. A reactive gas is flowed to the material on the substrate and is reactive with such material. After flowing the reactive gas, an inert purge gas is flowed through the chamber and through the vacuum pump. In one embodiment, the first exhaust line comprises a filter and the flowing of the inert purge gas to the vacuum pump is through a second exhaust line not comprising the filter in the first exhaust line and independent of whether the second exhaust line comprises another pump through which the inert purge gas flows prior to flowing to the vacuum pump. In one embodiment, the flowing of the inert purge gas to the vacuum pump is through a second exhaust line comprising another pump through which the inert purge gas flows prior to flowing to the vacuum pump independent of whether the first exhaust line includes any filter.

Regardless, exposing to the first and second deposition precursors effective for thermal CVD, flowing of the reactive gas, and flowing of the inert purge gas are repeated effective to deposit material of desired thickness on the substrate.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A thermal chemical vapor deposition method, comprising:
   exposing a substrate within a chamber to first and second deposition precursors effective to thermally chemical vapor deposit a material on the substrate, and exhausting unreacted first and second deposition precursors from the chamber through a vacuum pump via a first exhaust line comprising a filter;
   flowing a reactive gas to the material on the substrate, the reactive gas being reactive with the material;
   after flowing the reactive gas, flowing an inert purge gas through the chamber and through the vacuum pump, the flowing of the inert purge gas to the vacuum pump being through a second exhaust line not comprising the filter and comprising another pump through which the inert purge gas flows to the vacuum pump; and
   repeating the thermal chemical vapor depositing material, exhausting of unreacted first and second deposition precursors, flowing of the reactive gas, and flowing of the inert purge gas effective to deposit material of desired thickness on the substrate, at least some of the reactive gas flowing through the second exhaust line.

2. The method of claim 1 wherein the reactive gas comprises one of the first and second deposition precursors.

3. The method of claim 1 wherein the reactive gas does not comprise either of the first or second deposition precursors.

4. The method of claim 1 wherein the exposing forms the material to comprise TiN.

5. The method of claim 4 wherein one of the first and second deposition precursors comprises $NH_3$, and the reactive gas comprises $NH_3$.

6. The method of claim 4 wherein one of the first and second deposition precursors comprises $NH_3$, and the reactive gas comprises $H_2$.

7. The method of claim 1 wherein the first exhaust line comprises multiple filters through which the exhausting occurs.

8. The method of claim 1 comprising flowing an inert purge gas to the material on the substrate intermediate the exposing and the flowing of the reactive gas.

9. The method of claim 1 wherein the second exhaust line comprises no filters through which the inert purge gas flows to the vacuum pump.

10. The method of claim 1 wherein individual of the inert gas flowings are less than 5 seconds in duration.

11. The method of claim 1 wherein individual of the inert gas flowings are no greater than 3 seconds in duration.

12. The method of claim 1 wherein the another pump is operated at equal pumping capacity to that of the vacuum pump during flow of the inert purge gas through the another pump.

13. The method of claim 1 wherein the another pump is operated at greater pumping capacity than that of the vacuum pump during flow of the inert purge gas through the another pump.

14. The method of claim 1 wherein the inert purge gas is precluded from flowing through the filter during at least most of the flowing of the inert purge gas.

15. A thermal chemical vapor deposition method, comprising:
   exposing a substrate within a chamber to first and second deposition precursors effective to thermally chemical vapor deposit a material on the substrate, and exhausting unreacted first and second deposition precursors from the chamber through a vacuum pump via a first exhaust line comprising two filters in series;

flowing a first inert purge gas through the chamber and through the vacuum pump via the first exhaust line;

after flowing the first inert purge gas, flowing one of the first and second deposition precursors to the material on the substrate and through the vacuum pump, the one of the first and second deposition precursors being reactive with the material;

after flowing the reactive gas, flowing a second inert purge gas through the chamber and through the vacuum pump, the flowing of the second inert purge gas to the vacuum pump being through a second exhaust line, the second exhaust line not comprising any filter and comprising another pump through which gas flows to the vacuum pump during the flowing the second inert purge gas; and repeating the thermal chemical vapor depositing material, exhausting of unreacted first and second deposition precursors, the flowing the first inert purge gas, the flowing of the one of the first and second deposition precursors, and the flowing the second inert purge gas effective to deposit material of desired thickness on the substrate, at least some of the reactive gas flowing through the second exhaust line.

16. A thermal chemical vapor deposition method, comprising:

exposing a substrate within a chamber to first and second deposition precursors effective to thermally chemical vapor deposit a material on the substrate, and exhausting unreacted first and second deposition precursors from the chamber through a vacuum pump via a first exhaust line;

flowing a reactive gas to the material on the substrate, the reactive gas being reactive with the material;

after flowing the reactive gas, flowing an inert purge gas through the chamber and through the vacuum pump, the flowing of the inert purge gas to the vacuum pump being through a second exhaust line comprising another pump through which the inert purge gas flows prior to flowing to the vacuum pump; and repeating the thermal chemical vapor depositing material, exhausting unreacted first and second deposition precursors, flowing of the reactive gas, and flowing of the inert purge gas effective to deposit material of desired thickness on the substrate, at least some of the reactive gas flowing through the second exhaust line.

17. A thermal chemical vapor deposition method of depositing titanium nitride on a substrate, comprising:

exposing the substrate within a chamber to $TiCl_4$ and $NH_3$ effective to thermally chemical vapor deposit a TiN-comprising material on the substrate, and exhausting unreacted $TiCl_4$ and $NH_3$ from the chamber through a vacuum pump via a first exhaust line comprising two filters in series, the TiN-comprising material comprising chlorine;

flowing a first inert purge gas through the chamber and through the vacuum pump;

after the flowing the first inert purge gas, flowing $NH_3$ to the TiN-comprising material on the substrate and through the vacuum pump, the $NH_3$ flowing removing chlorine from the TiN-comprising material;

after the $NH_3$ flowing, flowing a second inert purge gas through the chamber and through the vacuum pump, the flowing of the second inert purge gas to the vacuum pump being through a second exhaust line not comprising either of the two filters, the second exhaust line comprising another pump through which the inert purge gas flows to the vacuum pump; and repeating the thermal chemical vapor depositing TiN-comprising material, the exhausting, the first flowing, the $NH_3$ flowing, and the second flowing effective to deposit TiN-comprising material of desired thickness on the substrate at least some of the $NH_3$ flowing through the second exhaust line.

* * * * *